United States Patent
Law et al.

(10) Patent No.: US 9,331,227 B2
(45) Date of Patent: May 3, 2016

(54) DIRECTLY BONDED, LATTICE-MISMATCHED SEMICONDUCTOR DEVICE

(71) Applicant: The Boeing Company, Chicago, IL (US)

(72) Inventors: Daniel C. Law, Arcadia, CA (US); Richard R. King, Thousand Oaks, CA (US); Dimitri Daniel Krut, Encino, CA (US); Dhananjay Bhusari, Santa Clarita, CA (US)

(73) Assignee: THE BOEING COMPANY, Chicago, IL (US)

( * ) Notice: Subject to any disclaimer, the term of this patent is extended or adjusted under 35 U.S.C. 154(b) by 190 days.

(21) Appl. No.: 14/152,464

(22) Filed: Jan. 10, 2014

(65) Prior Publication Data
US 2015/0200321 A1    Jul. 16, 2015

(51) Int. Cl.
| | |
|---|---|
| *H01L 21/02* | (2006.01) |
| *H01L 31/0725* | (2012.01) |
| *H01L 21/18* | (2006.01) |
| *H01L 31/18* | (2006.01) |

(52) U.S. Cl.
CPC .......... *H01L 31/0725* (2013.01); *H01L 21/187* (2013.01); *H01L 31/18* (2013.01)

(58) Field of Classification Search
CPC ............... H01L 31/18; H01L 21/187; H01L 2224/48091; H01L 2924/00014; H01L 33/06; H01L 33/22; H01L 31/0725; H01L 31/3725; C04B 41/4529; C04B 41/5111; C04B 41/5133
USPC ............... 257/94, 97, 190, 616, E29.193, 257/E21.125; 438/47, 94, 191
See application file for complete search history.

(56) References Cited

U.S. PATENT DOCUMENTS

| | | | | |
|---|---|---|---|---|
| 6,645,829 | B2* | 11/2003 | Fitzergald | G02B 6/12 257/E21.569 |
| 6,927,147 | B2* | 8/2005 | Fitzgerald | H01L 21/2007 257/E21.568 |
| 6,951,819 | B2* | 10/2005 | Iles | H01L 31/0687 438/705 |
| 2002/0052061 | A1 | 5/2002 | Fitzgerald | |
| 2003/0213950 | A1 | 11/2003 | Hwang | |
| 2005/0067377 | A1 | 3/2005 | Lei et al. | |
| 2005/0274411 | A1* | 12/2005 | King | H01L 31/0687 136/256 |
| 2006/0185582 | A1* | 8/2006 | Atwater, Jr. | C30B 33/06 117/89 |
| 2007/0131275 | A1* | 6/2007 | Kinsey | H01L 31/022466 136/255 |
| 2010/0116327 | A1* | 5/2010 | Cornfeld | H01L 31/06875 136/255 |
| 2011/0124146 | A1* | 5/2011 | Pitera | H01L 31/0687 438/64 |
| 2012/0138116 | A1 | 6/2012 | Bhusari et al. | |
| 2014/0137930 | A1* | 5/2014 | Derkacs | H01L 31/0735 136/255 |

OTHER PUBLICATIONS

EP, European Search Report and Opinion; European Patent Application No. 15150677.1 (May 19, 2015).
(Continued)

*Primary Examiner* — Yosef Gebreyesus
(74) *Attorney, Agent, or Firm* — Thompson Hine LLP

(57) ABSTRACT

A semiconductor device may include a first subassembly and a second subassembly. The first subassembly may include a first bonding layer. The second subassembly may include a second substrate and a second bonding layer directly bonded to the first bonding layer. The first bonding layer and the second bonding layer may be lattice-mismatched to one another. At least one of the following may be selected: the first bonding layer is lattice-mismatched to the first substrate, and the second bonding layer is lattice-mismatched to the second substrate.

18 Claims, 8 Drawing Sheets

(56) References Cited

OTHER PUBLICATIONS

Bhusari, D. et al., "Direct Semiconductor Bonding Technology (SBT) for High Efficiency III-V Multi-Junction Solar Cells," Proceedings of the 37th IEEE Photovoltaic Specialist Conference, pp. 001937-001940 (2011).

Law, D.C., "Semiconductor-Bonded III-V Multijunction Space Solar Cells," Proceedings of the 34th IEEE Photovoltaic Specialist Conference, pp. 002237-002239 (2009).

* cited by examiner

DIRECTLY BONDED, LATTICE-MISMATCHED SEMICONDUCTOR DEVICE

This disclosure was made with U.S. Government support under Contract No. NRO000-11-C-0368. The U.S. Government has certain rights in this disclosure.

FIELD

The disclosed system and method relate to a semiconductor device and, more particularly, to a directly bonded, lattice-mismatched semiconductor device.

BACKGROUND

Wafer joining technology may be used to integrate various properties from different materials into one compact process-compatible material system. Wafer joining technology has great potential. For example, joining GaAs or InP-based materials to other semiconductor materials may result in the integration of optical, photovoltaic, and electronic devices and enhance the performance of computers, solar cells, light emitting diodes and other electronic devices.

Group III-V semiconductor materials are comprised of one or more elements from Group III of the periodic table and one or more elements from Group V of the periodic table. One of the limitations of Group III-V semiconductor devices, such as multi junction solar cells, is the need to incorporate various lattice-matched device components within a semiconductor device. Specifically, lattice-matching may limit the possible bandgap combinations between device components in the semiconductor device. Thus, in an effort to expand or widen the bandgap combinations between various device components within a semiconductor device, inverted metamorphic (IMM) technologies may be employed to grow device components that are lattice-mismatched to their growth substrate. Specifically, IMM technologies may invert the usual growth order of device components, where the lattice-mismatched device components may be grown last. Moreover, multiple transparent buffer layers may be used to absorb the strain of the lattice-mismatch between various device components. However, incorporating multiple transparent buffer layers may increase the cost of the semiconductor device. Moreover, the resulting semiconductor device grown using IMM technologies may require an additional device handle, which also adds cost to the semiconductor device.

In another approach to create a semiconductor device, lattice-matched materials of specific bandgap combinations may be directly bonded to one another. A sacrificial lateral etch layer and an epitaxial lift-off process may be employed to recycle the growth substrate in an effort to reduce cost. Some examples of the growth substrate include GaAs-based, InP-based, and GaSb-based materials. However, there still exists a need for a cost-effective semiconductor device having a relatively wide range of bandgap combinations between device components.

SUMMARY

In one embodiment, a semiconductor device may include a first subassembly and a second subassembly. The first subassembly may include a first bonding layer and a first substrate. The second subassembly may include a second substrate and a second bonding layer that may be directly bonded to the first bonding layer. The first bonding layer and the second bonding layer may be lattice-mismatched with one another. At least one of the following may be selected: the first bonding layer is lattice-mismatched to the first substrate, and the second bonding layer is lattice-mismatched to the second substrate In another embodiment, a method of making a semiconductor device may include providing a first subassembly comprising a first bonding layer and a first substrate. The method may also include providing a second subassembly comprising a second substrate and a second bonding layer. The method may also include directly bonding the first bonding layer and the second bonding layer together. The first bonding layer and the second bonding layer may be lattice-mismatched to one another. At least one of the following is selected: the first bonding layer may be lattice-mismatched to the first substrate, and the second bonding layer is lattice-mismatched to the second substrate.

Other objects and advantages of the disclosed method and system will be apparent from the following description, the accompanying drawings and the appended claims.

DETAILED DESCRIPTION

Figure 1:
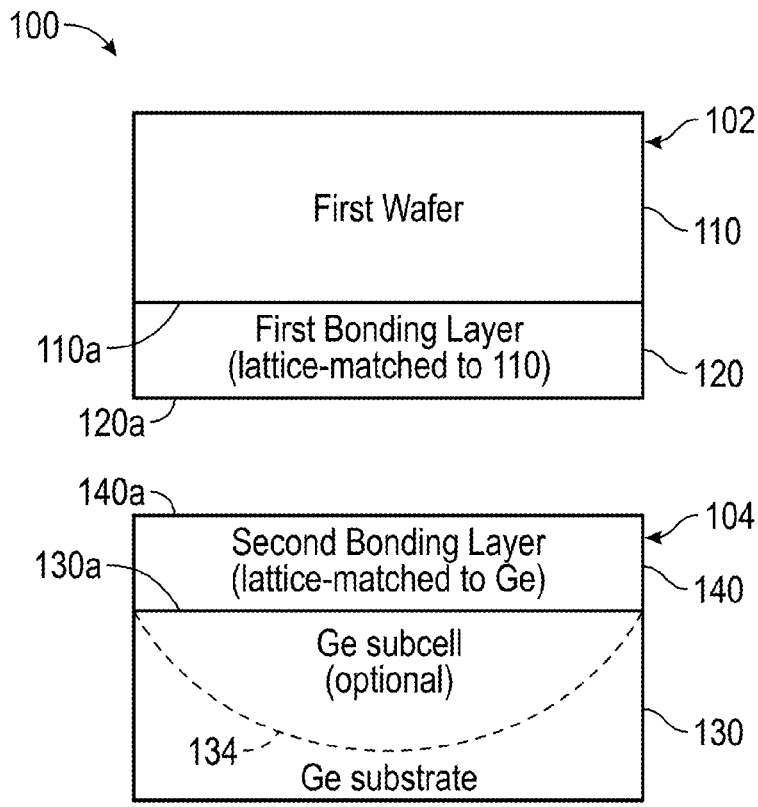
FIG. 1 is an illustration of an embodiment of a preassembled structure including a first subassembly and a second subassembly.

As shown in FIG. 1, a preassembled structure 100 according to an embodiment of the disclosure may include a first subassembly 102 and a second subassembly 104. The first subassembly 102 may include a first wafer 110 and a first bonding layer 120 directly adjacent and upon a first surface 110a of the first wafer 110. The first wafer 110 may be a semiconductor selected from group III-V materials. In an embodiment, the first wafer 110 may be selected from the group consisting of silicon (Si), germanium (Ge), GaAs-based, InP-based, GaP based, GaSb-based, Ga(In)N-based materials. The first surface 110a of the first wafer 110 may be a surface of a material layer selected from the group consisting of silicon (Si), germanium (Ge), Gallium Arsenide (GaAs), Indium Phosphide (InP), Gallium Phosphide (GaP), Gallium Antimonide (GaSb), Gallium Indium Arsenide (GaInAs), Gallium Indium Phosphide (GaInP), Gallium Indium Nitride Ga(In)N materials.

The first bonding layer 120 may be epitaxially grown upon the first surface 110a of the first wafer 110. In one embodiment, the first bonding layer 120 may be an (Al)(Ga)InP(As)(Sb) material having a relatively high dopant concentration equal to or greater than about $5\times10^{18}/cm^3$. It is to be understood that a relatively high doping concentration may not be necessary for sufficient mechanical bonding, but may be needed for achieving a low electrical resistance across a bonded interface (shown in FIG. 2 as a bonded interface 150). However, if a low electrical resistance across the bonded interface 150 is not required, then a relatively high doping concentration in the first bonding layer 120 may not be necessary. As used herein, and as conventional in the art, the use of parentheses in the (Al)(Ga)InP(As)(Sb) material indicates that the incorporation of aluminum, gallium, arsenic, and antimony is optional. In the embodiment as shown in FIG. 1, the first bonding layer 120 may be lattice-matched to the first wafer 110, and may include a first bonding surface 120a.

The second subassembly 104 may include a second wafer 130 and a second bonding layer 140. In the embodiment as shown in FIG. 1, the second bonding layer 140 may be directly adjacent and upon a second surface 130a of the second wafer 130. In one non-limiting embodiment, the second wafer 130 may be a Ge substrate wafer. However, it is to be understood that the second wafer 130 may be constructed of other materials as well such as, for example, GaAs. The second wafer 130 may be used as a growth substrate as well as for structural support. Specifically, the second wafer 130 may be used as a substrate for epitaxial growth of the second bonding layer 140 as well as the main mechanical support for an assembled semiconductor device 200 (shown in FIG. 2).

In one embodiment, the second wafer 130 may include an active Ge subcell 134. However, it is to be understood that in some embodiments, the Ge subcell 134 may be omitted. In one exemplary embodiment, the Ge subcell 134 may include an energy bandgap of about 0.67 eV. The Ge subcell 134 may be created by a diffusion of dopants into a surface layer of the second wafer 130. In other words, the Ge subcell 134 may not be epitaxially grown. Thus, the Ge subcell may be part of the second wafer 130.

The second bonding layer 140 may be epitaxially grown upon the second surface 130a of the second wafer 130. Similar to the first bonding layer 120, in one embodiment the second bonding layer 140 may also be an (Al)(Ga)InP(As)(Sb) material having a relatively high dopant concentration equal to or greater than about $5\times10^{18}/cm^3$. It is to be understood that a relatively high doping concentration may not be necessary for sufficient mechanical bonding, but may be needed for achieving a low electrical resistance across the bonded interface (shown in FIG. 2 as the bonded interface 150). However, if a low electrical resistance across the bonded interface is not required, then a relatively high doping concentration in the second bonding layer 140 may not be necessary.

In the exemplary embodiment as shown in FIG. 1, the second bonding layer 140 may be lattice-matched to the second wafer 130 of the second subassembly 104. However, it is to be understood that in other embodiments the second bonding layer 140 may also be lattice-mismatched to the second wafer 130 as well, and are described in detail below and illustrated in FIGS. 4-9. The second bonding layer 140 of the second subassembly 104 may be lattice-mismatched to the first bonding layer 120 of the first subassembly 102. In all the embodiments as described and shown in FIGS. 1-9, the first bonding layer 120 and the second bonding layer 140 may be lattice-mismatched to one another.

Figure 2:
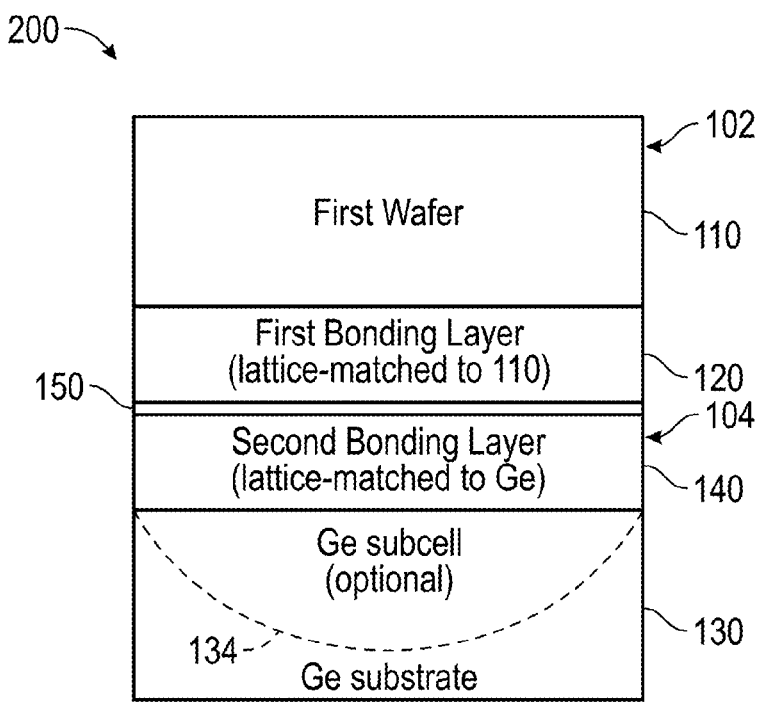
FIG. 2 is an illustration of the first subassembly and the second subassembly shown in FIG. 1 directly bonded to one another to create a semiconductor device.

FIG. 2 is an illustration of the semiconductor device 200 according to an embodiment of the disclosure, where the first bonding layer 120 and the second bonding layer 140 have been bonded together to join the first subassembly 102 to the second subassembly 104. In one embodiment, the semiconductor device 200 may be a photovoltaic device, a solar cell, a light sensor, light emitting diode, or a transistor.

The first subassembly 102 and the second subassembly 104 may be directly bonded to one another by placing the first bonding layer 120 and the second bonding layer 140 in direct contact with one another, where heat and pressure may be applied to bond the first subassembly 102 and the second subassembly 104 together. Referring to FIGS. 1-2, the first bonding surface 120a and a second bonding surface 140a may be placed in contact with one another, and diffuse together to form the bonded interface 150. In one embodiment, the first bonding surface 120a and the second bonding surface 140a may be polished prior to bringing the first bonding layer 120 and the second bonding layer 140 into contact. In one embodiment, the polishing may be performed by Chemical Mechanical Polishing (CMP), with bonding performed using conventional wafer bonding equipment.

Once the first bonding surface 120a and the second bonding surface 140b have been placed into contact with one another, the first subassembly 102 and the second subassembly 104 may be heated to a bonding temperature of between about 300° C. to about 500° C. The semiconductor device 200 may be heated at a pressure of between about 20 psi and about 50 psi. The semiconductor device 200 may be heated under pressure for about 20 to 300 minutes.

Direct semiconductor bonding with (Al)GaInP(As)(Sb) bonding layers has achieved bond strength greater than 4.1 $J/m^2$, electrical resistance as low as 0.3 Ohm-$cm^2$ and optical transparency of greater than 97% across a bonded interface (e.g., the bonded interface 150 as shown in FIG. 2). After direct bonding, the first wafer 110 may be removed.

Figure 3:
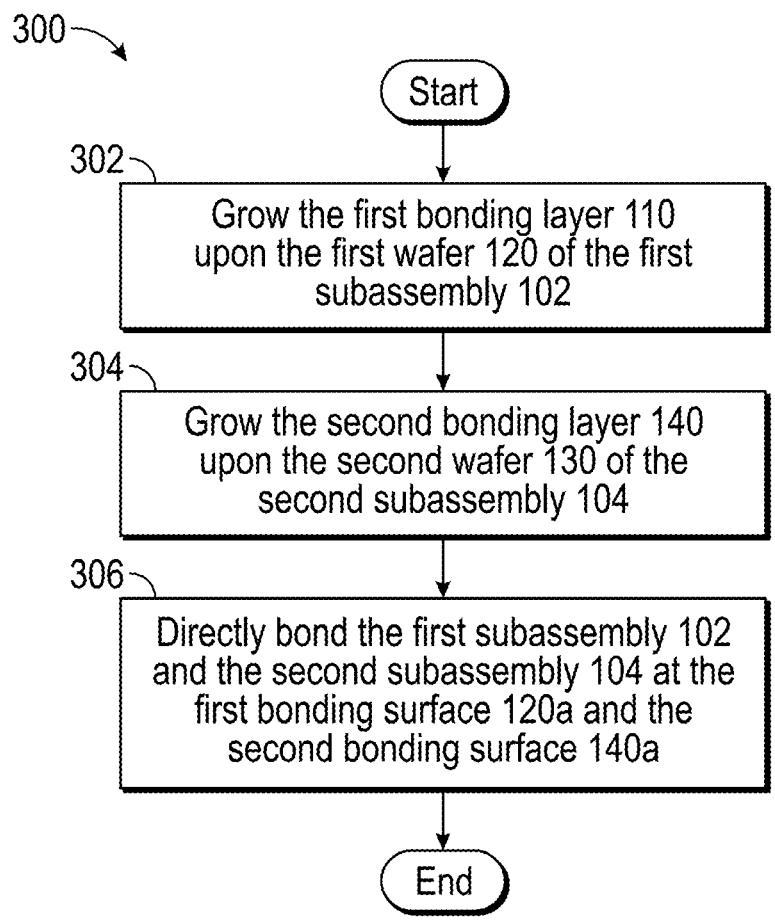
FIG. 3 is an exemplary process flow diagram illustrating a method of fabricating the semiconductor device shown in FIG. 2.

FIG. 3 illustrates an exemplary process flow diagram of a method 300 for creating the semiconductor device 200 as shown in FIG. 2. Referring generally to FIGS. 1-3, method 300 may begin at block 302, where the first bonding layer 120 may be epitaxially grown upon the first surface 110a of the first wafer 110 of the first subassembly 102. As discussed above, the first bonding layer 120 may be lattice-matched to the first wafer 110. Method 300 may then proceed to block 304.

In block 304, the second bonding layer 140 may be epitaxially grown upon the second surface 130a of the second wafer 130 of the second subassembly 104. As discussed above, the second bonding layer 140 may be lattice-matched to the second wafer 130. However the second bonding layer 140 of the second subassembly 104 may be lattice-mismatched to the first bonding layer 120 of the first subassembly 102. Method 300 may then proceed to block 306.

In block 306, the first subassembly 102 and the second subassembly 104 may be directly bonded to one another at the first bonding surface 120a and the second bonding surface 140a, thus creating the semiconductor device 200 (shown in FIG. 2). Specifically, the first bonding surface 120a and the second bonding surface 140a (FIG. 1) may be placed in contact with one another, and heated to the bonding temperature. The first bonding layer 120 and the second bonding layers 140 diffuse together to form the bonded interface 150 (seen in FIG. 2). Method 300 may then terminate.

Figure 4:
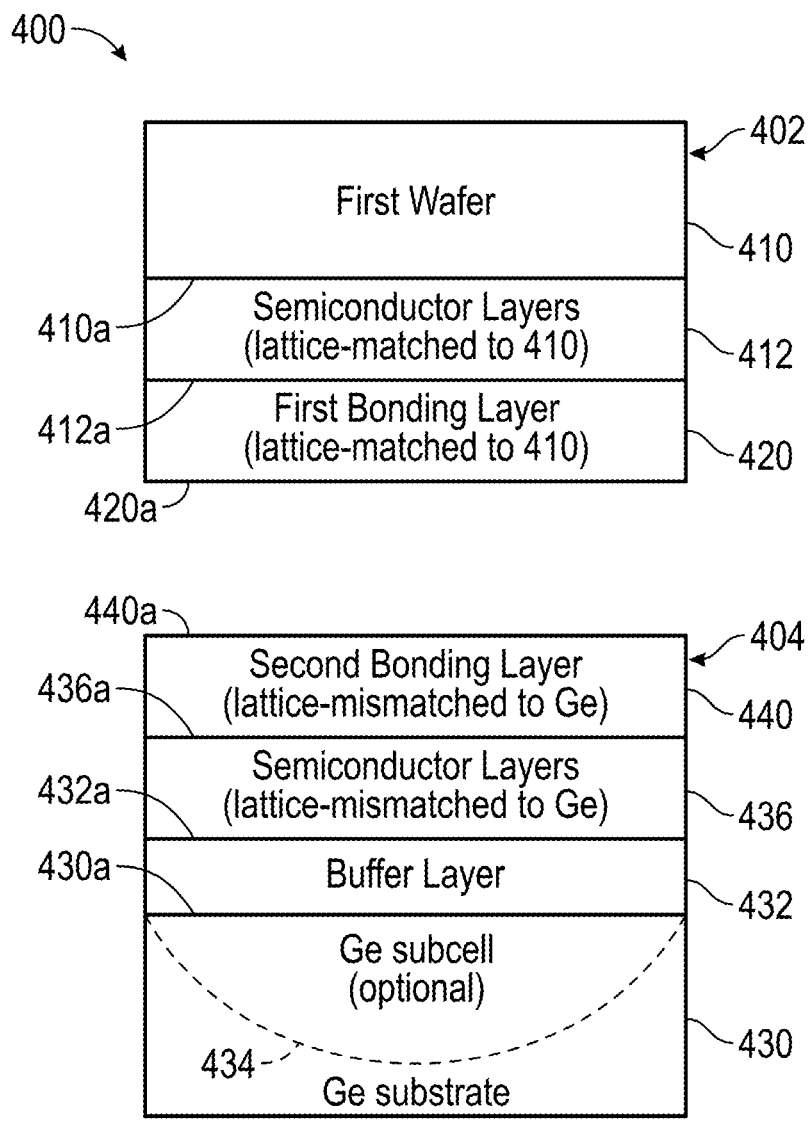
FIG. 4 is an illustration of another embodiment of a preassembled structure including a first subassembly and a second subassembly.

FIG. 4 illustrates an alternative embodiment of preassembled structure 400 according to an embodiment of the disclosure. The preassembled structure 400 may include a first subassembly 402 and a second subassembly 404. The first subassembly 402 may include a first wafer 410, semiconductor layers 412, and a first bonding layer 420. The semiconductor layers 412 may be directly adjacent and upon a first surface 410a of the first wafer 410. In one embodiment, the semiconductor layers 412 may be a photovoltaic device, or a solar cell having one or more subcells. The first bonding layer 420 may be directly adjacent and upon a semiconductor surface 412a of the semiconductor layers 412. Similar to the embodiment as described above and shown in FIGS. 1-3, the first wafer 410 may be a semiconductor selected from group III-V materials. In an embodiment, the first wafer 410 may be selected from the group consisting of silicon (Si), germanium (Ge), Gallium Arsenide (GaAs), Indium Phosphide (InP), Gallium Phosphide (GaP), Gallium Antimonide (GaSb), Gallium Indium Arsenide (GaInAs), Gallium Indium Phosphide (GaInP), Gallium Indium Nitride Ga(In)N materials.

The semiconductor layers 412 may be epitaxially grown upon the first surface 410a of the first wafer 410. The semiconductor layers 412 may be lattice-matched to the first wafer 410. The first bonding layer 420 may be epitaxially grown upon the semiconductor surface 412a of the semiconductor layers 412. Similar to the embodiment as shown in FIGS. 1-3 and described above, the first bonding layer 420 may be an (Al)(Ga)InP(As)(Sb) material, and in one embodiment may have a relatively high dopant concentration equal to or greater than about $5 \times 10^{18}/cm^3$. The first bonding layer 420 may also be lattice-matched to the first wafer 410, and may include a first bonding surface 420a.

The second subassembly 404 may include a second wafer 430, a buffer layer 432, semiconductor layers 436, and a second bonding layer 440. In the embodiment as shown in FIG. 4, the buffer layer 432 may be directly adjacent and upon a second surface 430a of the second wafer 430. The semiconductor layers 436 may be directly adjacent and upon a buffer surface 432a of the buffer layer 432. The second bonding layer 440 may be directly adjacent and upon a semiconductor surface 436a of the semiconductor layers 436.

Similar to the embodiment as described above and shown in FIGS. 1-3, the second wafer 430 may be a Ge substrate, and may be used as a growth substrate as well as for structural support. Specifically, the second wafer 430 may be used as a substrate for epitaxial growth of the buffer layer 432 as well the main mechanical support for an assembled semiconductor device 500 (shown in FIG. 5). The buffer layer 432 may be epitaxially grown upon the second surface 430a of the second wafer 430. In one embodiment, the second wafer 430 may include an active Ge subcell 434. However, it is to be understood that in some embodiments, the Ge subcell 434 may be omitted.

In the embodiment as shown in FIG. 4, the buffer layer 432 may be epitaxially grown upon the second surface 430a of the second wafer 430. The buffer layer 432 may be a metamorphic transparent graded buffer. In the embodiments as described, the term transparent may be defined as a transmission of equal to or greater than about ninety-seven percent of the light or electromagnetic radiation of a wavelength for activating a cell or subcell disposed underneath. The buffer layer 432 may be used to epitaxially grow material that is lattice-mismatched to the second wafer 430. For example, in the embodiment as shown in FIG. 4 the buffer layer 432 may be used to grow the semiconductor layers 436. The semiconductor layers 436 may be lattice-mismatched to the second wafer 430. The buffer layer 432 may absorb the strain of lattice-mismatch, and generally prevents the vertical propagation of dislocations.

The second bonding layer 440 may be epitaxially grown upon the semiconductor surface 436a of the semiconductor layers 436. The second bonding layer 440 may include a second bonding surface 440a. Similar to the first bonding layer 420, the second bonding layer 440 may be an (Al)(Ga)InP(As)(Sb) material, and may have a relatively high dopant concentration equal to or greater than about $5 \times 10^{18}/cm^3$. In the embodiment as shown in FIG. 4, both the semiconductor layers 436 and the second bonding layer 440 of the second subassembly 404 may be lattice-mismatched to the second wafer 430. The second bonding layer 440 may be lattice-matched to the semiconductor layers 436. Moreover, the first bonding layer 420 of the first subassembly 402 may be lattice-mismatched to the second bonding layer 440 of the second subassembly 404.

Figure 5:
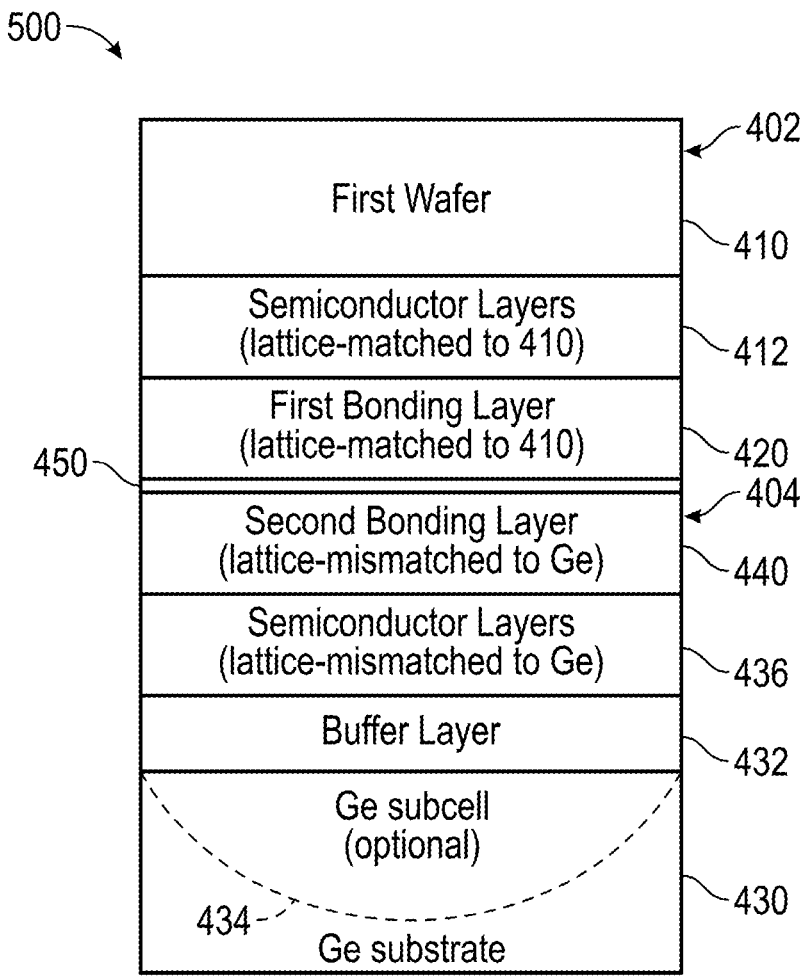
FIG. 5 is an illustration of the first subassembly and the second subassembly shown in FIG. 4 directly bonded to one another to create a semiconductor device.

FIG. 5 is an illustration of the semiconductor device 500 according to an embodiment of the disclosure, where the first bonding layer 420 and the second bonding layer 440 have been bonded together to join the first subassembly 402 to the second subassembly 404. Similar to the embodiment as shown in FIG. 2, the first subassembly 402 and the second subassembly 404 may be directly bonded to one another by placing the first bonding layer 420 and the second bonding layer 440 in direct contact with one another, where heat and pressure may be applied to bond the first subassembly 402 and the second subassembly 404 together. Referring to FIGS. 4-5, the first bonding surface 420a and the second bonding surface 440a may be placed in contact with one another, and diffuse together to form the bonded interface 450.

Figure 6:
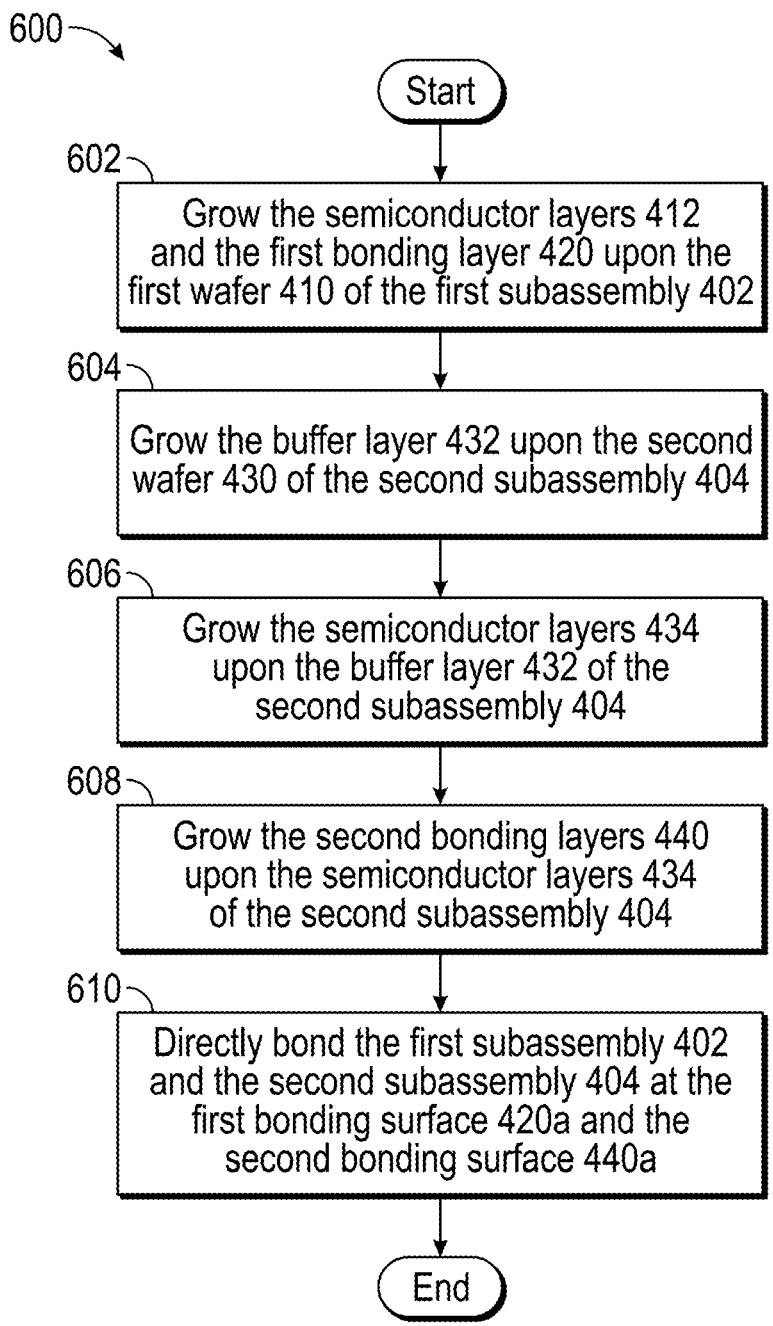
FIG. 6 is an exemplary process flow diagram illustrating a method of fabricating the semiconductor device shown in FIG. 5.

FIG. 6 illustrates an exemplary process flow diagram of a method 600 for creating the semiconductor device 500 as shown in FIG. 5. Referring generally to FIGS. 4-6, the method 600 may begin at block 602, where the semiconductor layers 412 and the first bonding layer 420 may be epitaxially grown upon the first wafer 410 of the first subassembly 402. Specifically, the semiconductor layers 412 may be grown upon the first surface 410a of the first wafer 410, and the first bonding layer 420 may be epitaxially grown upon the semiconductor surface 412a of the semiconductor layers 412. Method 600 may then proceed to block 604.

In block 604, the buffer layer 432 may be epitaxially grown upon the second surface 430a of the second wafer 430 of the second subassembly 404. Method 600 may then proceed to block 606.

In block 606, the semiconductor layers 436 may be epitaxially grown upon the buffer surface 432a of the buffer layer 432 of the second subassembly 404. As described above, the semiconductor layers 436 may be lattice-mismatched to the second wafer 430. Method 600 may then proceed to block 608.

In block 608, the second bonding layer 440 may be epitaxially grown upon the semiconductor surface 436a of the semiconductor layers 436 of the second subassembly 404. As discussed above, the second bonding layer 440 may be lattice-mismatched to the second wafer 430. The second bonding layer 440 may also be lattice-mismatched to the first bonding layer 420 of the first subassembly 402. Method 600 may then proceed to block 610.

In block 610, the first subassembly 402 and the second subassembly 404 may be directly bonded to one another at the first bonding surface 420a and the second bonding surface 440a, thus creating the semiconductor device 500 (shown in FIG. 5). Specifically, the first bonding surface 420a and the second bonding surface 440a (FIG. 4) may be placed in contact with one another, and heated to the bonding temperature. The first bonding layer 420 and the second bonding layer 440 diffuse together to form the bonded interface 450 (seen in FIG. 5). Method 600 may then terminate.

Figure 7:
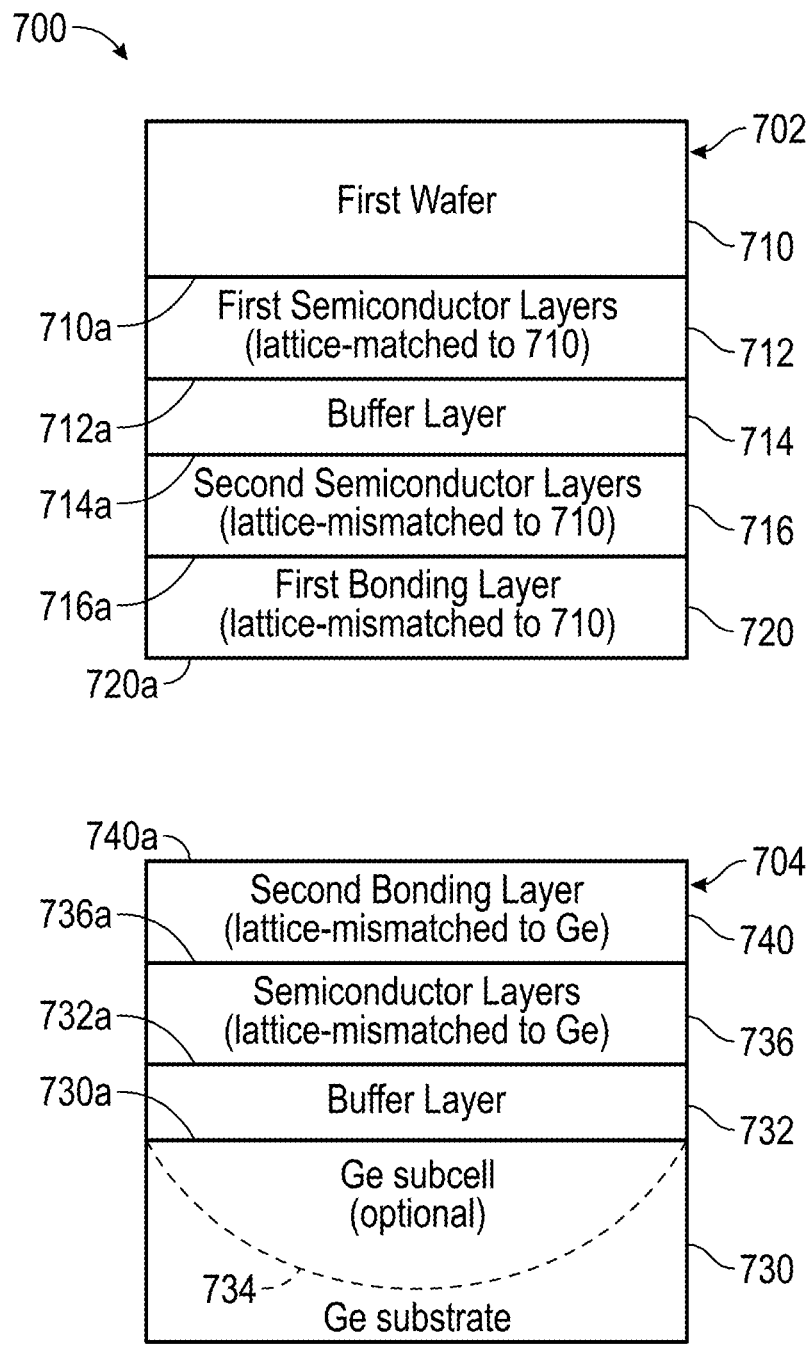
FIG. 7 is an illustration of yet another embodiment of a preassembled structure including a first subassembly and a second subassembly.

FIG. 7 illustrates an alternative embodiment of preassembled structure 700 according to an embodiment of the disclosure. The preassembled structure 700 may include a first subassembly 702 and a second subassembly 704. The first subassembly 702 may include a first wafer 710, first semiconductor layers 712, a buffer layer 714, second semiconductor layers 716, and a first bonding layer 720. The first semiconductor layers 712 may be directly adjacent and upon a first surface 710a of the first wafer 710. In one embodiment, the first semiconductor layers 712 may be a photovoltaic device, or a solar cell having one or more subcells. The buffer layer 714 may be epitaxially grown upon a first semiconductor surface 712a of the first semiconductor layers 712. Similar to the buffer layer 432 of the second subassembly 404 shown in FIGS. 4-5, the buffer layer 714 may also be a metamorphic transparent graded buffer. The second semiconductor layers 716 may be directly adjacent and upon a buffer surface 714a of the buffer layer 714. The second semiconductor layers 716 may also be a photovoltaic device, or a solar cell having one or more subcells. The first bonding layer 720 may be directly adjacent and upon a second semiconductor surface 716a of the second semiconductor layers 716.

Similar to the embodiments as described above and shown in FIGS. 1-6, the first wafer 710 may be a semiconductor selected from group III-V materials. In an embodiment, the first wafer 710 may be selected from the group consisting of silicon (Si), germanium (Ge), Gallium Arsenide (GaAs), Indium Phosphide (InP), Gallium Phosphide (GaP), Gallium Antimonide (GaSb), Gallium Indium Arsenide (GaInAs), Gallium Indium Phosphide (GaInP), Gallium Indium Nitride Ga(In)N materials. The first semiconductor layers 712 may be epitaxially grown upon the first surface 710a of the first wafer 710, and may be lattice-matched to the first wafer 710.

The buffer layer 714 may be epitaxially grown upon the first semiconductor surface 712a of the first semiconductor layer 712. The buffer layer 714 may be used to epitaxially grow material that is lattice-mismatched to the first wafer 710. For example, in the embodiment as shown in FIG. 7 the buffer layer 714 may be used to grow the second semiconductor layers 716, which may be lattice-mismatched to the first wafer 710.

The first bonding layer 720 may be epitaxially grown upon the second semiconductor surface 716a of the second semiconductor layers 716. Similar to the embodiment as shown in FIGS. 1-6 and described above, the first bonding layer 720 may be an (Al)(Ga)InP(As)(Sb) material, and in one embodiment may have a relatively high dopant concentration equal to or greater than about $5 \times 10^{18}/cm^3$. In the embodiment as shown in FIG. 7, the first bonding layer 720 may be lattice-mismatched to the first wafer 710 and lattice-matched to the second semiconductor layers 716, and may include a first bonding surface 720a.

The second subassembly 704 may include a second wafer 730, a buffer layer 732, semiconductor layers 736, and a second bonding layer 740. In the embodiment as shown in FIG. 7, the buffer layer 732 may be directly adjacent and upon a second surface 730a of the second wafer 730. The semiconductor layers 736 may be directly adjacent and upon a buffer surface 732a of the buffer layer 732. The second bonding layer 740 may be directly adjacent and upon a semiconductor surface 736a of the semiconductor layers 736.

Similar to the embodiment as described above and shown in FIGS. 1-6, the second wafer 730 may be a Ge substrate, and may be used as a growth substrate as well as for structural support. Specifically, the second wafer 730 may be used as a substrate for epitaxial growth of the buffer layer 732, as well as the main mechanical support for an assembled semiconductor device 800 (shown in FIG. 8). The buffer layer 732 may be epitaxially grown upon the second surface 730a of the second wafer 730. In one embodiment, the second wafer 730 may include an active Ge subcell 734. However, it is to be understood that in some embodiments, the Ge subcell 734 may be omitted.

The buffer layer 732 may be epitaxially grown upon the second surface 730a of the second wafer 730. The buffer layer 732 may be a metamorphic transparent graded buffer. The buffer layer 732 may be used to epitaxially grow material that is lattice-mismatched to the second wafer 730. For example, in the embodiment as shown in FIG. 7, the buffer layer 732 may be used to grow the semiconductor layers 736, which may be lattice-mismatched to the second wafer 730. Specifically, the semiconductor layers 736 may be epitaxially grown upon the buffer surface 732a of the buffer layer 732.

The second bonding layer 740 may be epitaxially grown upon the semiconductor surface 736a of the semiconductor layers 736. The second bonding layer 740 may include a second bonding surface 740a. Similar to the first bonding layer 720 of the first subassembly 702, the second bonding layer 440 may be an (Al)(Ga)InP(As)(Sb) material, and may have a relatively high dopant concentration equal to or greater than about $5 \times 10^{18}/cm^3$. In the embodiment as shown in FIG. 7, both the semiconductor layers 736 and the second bonding layer 740 of the second subassembly 704 may be lattice-mismatched to the second wafer 730. The semiconductor layers 736 and the second bonding layer 740 may be lattice-matched to each other. Moreover, the first bonding layer 720 of the first subassembly 702 may be lattice-mismatched to the second bonding layer 740 of the second subassembly 704.

Figure 8:
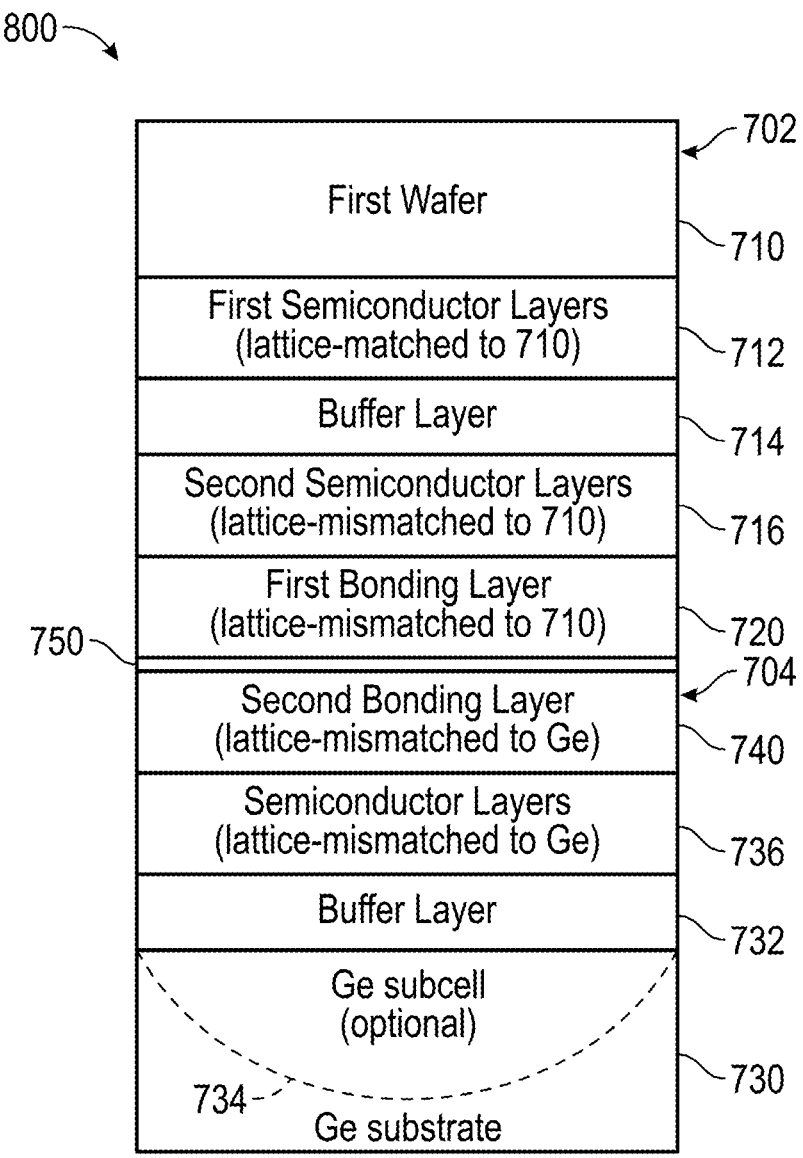
FIG. 8 is an illustration of the first subassembly and the second subassembly shown in FIG. 7 directly bonded to one another to create a semiconductor device.

FIG. 8 is an illustration of the semiconductor device 800 according to an embodiment of the disclosure, where the first bonding layer 720 and the second bonding layer 740 have been bonded together to join the first subassembly 702 to the second subassembly 704. Similar to the embodiment as shown in FIGS. 2 and 5, the first subassembly 702 and the second subassembly 704 may be directly bonded to one another by placing the first bonding layer 720 and the second bonding layer 740 in direct contact with one another, where heat and pressure may be applied to bond the first subassembly 702 and the second subassembly 704 together. Referring to FIGS. 7-8, the first bonding surface 720a and the second bonding surface 740a may be placed in contact with one another, and diffuse together to form a bonded interface 750.

Figure 9:
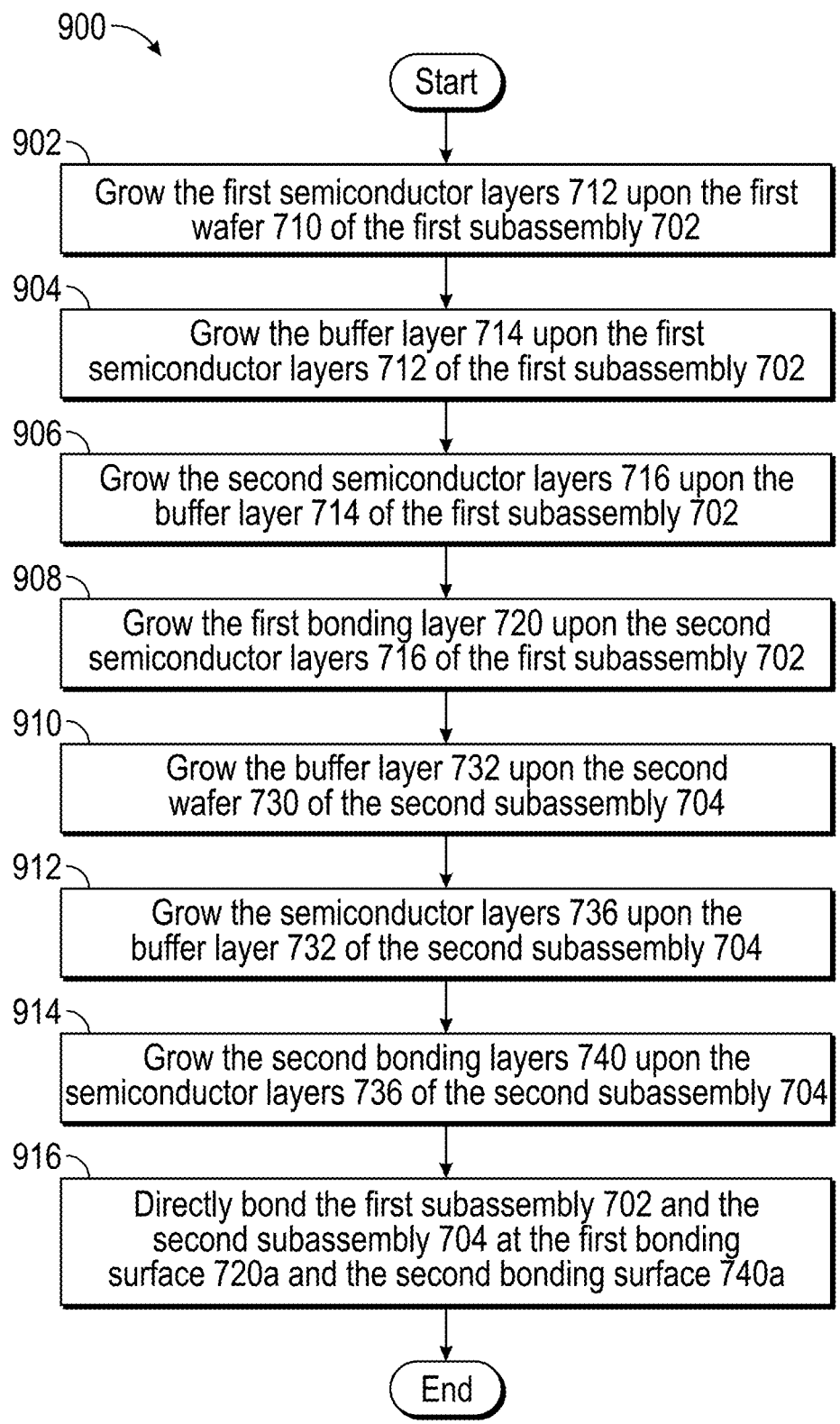
FIG. 9 is an exemplary process flow diagram illustrating a method of fabricating the semiconductor device shown in FIG. 8.

FIG. 9 illustrates an exemplary process flow diagram of a method 900 for creating the semiconductor device 800 as shown in FIG. 8. Referring generally to FIGS. 7-9, the method 900 may begin at block 902, where the first semiconductor layers 712 may be epitaxially grown upon the first wafer 710 of the first subassembly 702. As described above, the first semiconductor layers 712 may be lattice-matched to the first wafer 710. Method 900 may then proceed to block 904.

In block 904, the buffer layer 714 may be epitaxially grown upon the first semiconductor surface 712a of the first semiconductor layers 712 of the first subassembly 702. Method 900 may then proceed to block 906.

In block 906, the second semiconductor layers 716 may be epitaxially grown upon the buffer surface 714a of the buffer layer 714 of the first subassembly 702. As described above, the second semiconductor layers 716 may be lattice-mismatched to the first wafer 710. Method 900 may then proceed to block 908.

In block 908, the first bonding layer 720 may be epitaxially grown upon the second semiconductor surface 716a of the second semiconductor layers 716 of the first subassembly 702. As described above, the first bonding layer 720 may be lattice-mismatched to the first wafer 710, but may be lattice-matched to the second semiconductor layers 716. Method 900 may then proceed to block 910.

In block 910, the buffer layer 732 may be epitaxially grown upon the second surface 730a of the second wafer 730 of the second subassembly 704. Method 900 may then proceed to block 912.

In block 912, the semiconductor layers 736 may be epitaxially grown upon the buffer surface 732a of the buffer layer 732 of the second subassembly 704. As described above, the semiconductor layers 736 may be lattice-mismatched to the second wafer 730. Method 900 may then proceed to block 914.

In block 914, the second bonding layer 740 may be epitaxially grown upon the semiconductor surface 736a of the semiconductor layers 736 of the second subassembly 704. As discussed above, the second bonding layer 740 may be lattice-mismatched to the second wafer 730, as well as the first bonding layer 720 of the first subassembly 702. The second bonding layer 740 may also be lattice-matched to the semiconductor layers 736. Method 900 may then proceed to block 916.

In block 916, the first subassembly 702 and the second subassembly 704 may be directly bonded to one another at the first bonding surface 720a and the second bonding surface 740a, thus creating the semiconductor device 800 (shown in FIG. 8). Specifically, the first bonding surface 720a and the second bonding surface 740a (FIG. 7) may be placed in contact with one another, and heated to the bonding temperature. The first bonding layer 720 and the second bonding layer 740 diffuse together to form the bonded interface 750 (seen in FIG. 8). Method 900 may then terminate.

Referring generally to FIGS. 1-9, the disclosed semiconductor devices as described above may include a wider range of bandgap combinations between the various device components when compared to some other types of semiconductor devices currently available that only include directly bonded lattice-matched device components. This is because all the disclosed semiconductor devices as described above each include directly bonded lattice-mismatched device components. Lattice-mismatching various device components may widen the possible range of bandgap combinations and may also enhance material quality of the semiconductor device. It should be noted that direct bonding of metamorphic components is typically not practiced in industry at this time.

Additionally, the disclosed semiconductor devices each include the Ge substrate, and may include the active Ge subcell. The Ge subcell may be used to replace an epitaxially-grown GaInAs subcell including an energy bandgap of about 0.7 eV, which is typically found in a semiconductor device that is grown using inverted metamorphic (IMM) technologies. The Ge subcell may have equal or better performance retention after radiation when compared to the GaInAs subcell found in semiconductor devices grown using IMM technologies. Replacing the GaInAs subcell with the active Ge subcell may substantially reduce the overall cost of the semiconductor device. Moreover, semiconductor devices grown using IMM technologies may also require an additional device handle as well. In contrast, the disclosed Ge substrate may be used as the main mechanical support for the semiconductor device. Thus, no additional device handle may be needed. The disclosed Ge substrate may provide other benefits during semiconductor fabrication as well such as, for example, spalling compatibility, etching chemical selectivity, and simplicity in back-side metal contacts having substrate polarity. The Ge substrate may be relatively thin (e.g., having a thickness of about fifty microns), which may also reduce the overall mass of the disclosed semiconductor devices. Also, the Ge substrate may provide an enhanced power density.

For example, in one embodiment the disclosed semiconductor device may be a directly bonded five junction solar cell grown on a Ge substrate including an active Ge subcell. Specifically, the solar cell may be comprised of a first subassembly including lattice-matched device components with relatively high energy bandgaps (e.g., ranging from about 1.3 eV to about 2.0 eV). The first subassembly may be directly bonded to a second subassembly. The second subassembly may include the Ge substrate, a single buffer layer, and a device component grown upon the buffer layer and lattice-mismatched to the Ge substrate. The active Ge subcell of the Ge substrate and the device component of the second subassembly may include relatively low energy bandgaps (e.g., 0.67 eV for the Ge subcell and 1.0-1.1 eV for the device component). Some types of solar cells currently available that are grown using IMM technologies may include multiple buffer layers to absorb the strain of lattice-mismatch between various device components. In contrast, the exemplary solar cell as described only includes one buffer layer, which may reduce the overall cost.

While the forms of apparatus and methods herein described constitute preferred embodiments of this invention, it is to be understood that the invention is not limited to these precise forms of apparatus and methods, and the changes may be made therein without departing from the scope of the invention.

What is claimed is:

1. A semiconductor device, comprising:
    a first subassembly comprising a first bonding layer and a first substrate, wherein the first substrate is constructed of either a group III-V material or germanium (Ge); and
    a second subassembly, comprising:
        a second substrate constructed of Ge; and
        a second bonding layer directly bonded to the first bonding layer, wherein the first bonding layer and the second bonding layer are lattice-mismatched to one another, and wherein at least one of the following is selected:
        the first bonding layer is lattice-mismatched to the first substrate, and the second bonding layer is lattice-mismatched to the second substrate.

2. The semiconductor device of claim 1, wherein the second bonding layer is lattice-mismatched to the second substrate.

3. The semiconductor device of claim 2, wherein a buffer layer is epitaxially grown on the second substrate.

4. The semiconductor device of claim 1, wherein the second substrate includes an active Ge subcell.

5. The semiconductor device of claim 1, wherein the second subassembly includes semiconductor layers lattice-mismatched to the second substrate.

6. The semiconductor device of claim 1, wherein the first bonding layer is lattice-mismatched to the first substrate.

7. The semiconductor device of claim 1, wherein the first subassembly includes first semiconductor layers lattice-matched to the first substrate.

8. The semiconductor device of claim 7, wherein the first subassembly includes a buffer layer epitaxially grown on the first semiconductor layers.

9. The semiconductor device of claim 8, wherein the first subassembly includes second semiconductor layers lattice-mismatched to the first substrate.

10. The semiconductor device of claim 9, wherein the second semiconductor layers are epitaxially grown on the buffer layer.

11. The semiconductor device of claim 1, wherein at least one of the first subassembly and the second subassembly includes one of a photovoltaic device and a solar cell.

12. A method of making a semiconductor device, comprising:
providing a first subassembly comprising a first bonding layer and a first substrate, wherein the first substrate is constructed of either a group III-V material or germanium (Ge);
providing a second subassembly comprising a second substrate constructed of Ge and a second bonding layer;
directly bonding the first bonding layer and the second bonding layer together, wherein the first bonding layer and the second bonding layer are lattice-mismatched to one another; and
selecting at least one of the following:
lattice-mismatching the first bonding layer to the first substrate, and lattice-mismatching the second bonding layer to the second substrate.

13. The method of claim 12, comprising selecting lattice-mismatching the second bonding layer to the second substrate, and epitaxially growing a buffer layer on the second substrate.

14. The method of claim 13, comprising epitaxially growing the second bonding layer upon the buffer layer.

15. The method of claim 12, comprising creating an active Ge subcell within the second substrate by a diffusion of dopants into a layer of the second substrate.

16. The method of claim 12, comprising epitaxially growing first semiconductor layers upon the first substrate of the first subassembly, wherein the first semiconductor layers are lattice-matched to the first substrate.

17. The method of claim 16, comprising epitaxially growing a buffer layer upon the first semiconductor layers.

18. The method of claim 17, comprising epitaxially growing second semiconductor layers on the buffer layer, wherein the second semiconductor layers are lattice-mismatched to the first substrate, and wherein the first bonding layer is lattice-mismatched to the first substrate.

* * * * *